(12) United States Patent
Takada

(10) Patent No.: US 11,605,407 B2
(45) Date of Patent: Mar. 14, 2023

(54) MEMORY SYSTEM AND DELAY CONTROL METHOD

(71) Applicant: KIOXIA CORPORATION, Tokyo (JP)

(72) Inventor: Shuichi Takada, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/459,536

(22) Filed: Aug. 27, 2021

(65) Prior Publication Data

US 2022/0301607 A1    Sep. 22, 2022

(30) Foreign Application Priority Data

Mar. 22, 2021   (JP) .............................. JP2021-047534

(51) Int. Cl.
  *G11C 7/22*    (2006.01)
  *G11C 8/18*    (2006.01)
  *G11C 7/10*    (2006.01)

(52) U.S. Cl.
  CPC ............ *G11C 7/222* (2013.01); *G11C 7/1066* (2013.01); *G11C 7/1093* (2013.01); *G11C 8/18* (2013.01)

(58) Field of Classification Search
  CPC ...................................................... G11C 7/22
  USPC .................................................... 365/233.1
  See application file for complete search history.

(56) References Cited

U.S. PATENT DOCUMENTS

| 6,918,048 | B2 * | 7/2005 | Zumkehr ................. G11C 7/04 365/194 |
| 7,376,043 | B2 * | 5/2008 | Murayama ........... G11C 29/022 365/194 |
| 7,661,010 | B2 * | 2/2010 | DeFazio .................. G11C 7/22 365/219 |
| 8,819,475 | B2 | 8/2014 | Iijima |
| 9,443,572 | B2 | 9/2016 | Diffenderfer et al. |
| 9,496,879 | B1 | 11/2016 | Duan et al. |
| 9,684,332 | B2 | 6/2017 | Ogata et al. |
| 10,158,352 | B2 | 12/2018 | Hsu et al. |
| 2009/0238017 | A1 * | 9/2009 | Wakasa ................ H03K 5/1565 365/194 |

(Continued)

FOREIGN PATENT DOCUMENTS

| JP | 2012248088 A | 12/2012 |
| JP | 2014216921 A | 11/2014 |

(Continued)

*Primary Examiner* — Muna A Techane
(74) *Attorney, Agent, or Firm* — Kim & Stewart LLP

(57) ABSTRACT

According to one embodiment, a memory system includes a memory interface circuit. The memory interface circuit has delay circuits, a detection circuit, and a control circuit. One of the delay circuits applies a delay to a data signal. Another delay circuit generates, fora strobe signal, a first delay strobe signal, a second delay strobe signal, and a third delay strobe signal, each with different delay amounts. The detection circuit detects a drift in the timing of the first delay strobe signal with respect to the delayed data signal by using the delay data signal, the first delay strobe signal, the second delay strobe signal, and the third delay strobe signal. The control circuit adjusts the first delay amount, the second delay amount, and the third delay amount in a direction to compensate the drift.

20 Claims, 12 Drawing Sheets

(56) References Cited

U.S. PATENT DOCUMENTS

| | | |
|---|---|---|
| 2010/0246291 A1* | 9/2010 | Espinoza ............ G11C 7/1078 365/194 |
| 2015/0311907 A1 | 10/2015 | Wu et al. |
| 2015/0358007 A1 | 12/2015 | Diffenderfer et al. |
| 2017/0237442 A1 | 8/2017 | Kim et al. |
| 2018/0277179 A1 | 9/2018 | Wang |
| 2019/0287585 A1 | 9/2019 | Iijima |

FOREIGN PATENT DOCUMENTS

| | | |
|---|---|---|
| JP | 2018526912 A | 9/2018 |
| JP | 2019160238 A | 9/2019 |
| TW | I489482 B | 6/2015 |
| TW | 201610993 A | 3/2016 |
| TW | 201731214 A | 9/2017 |
| TW | 201826705 A | 7/2018 |
| TW | 201835914 A | 10/2018 |

* cited by examiner

STAGE NUMBER ADJUSTMENT SIGNAL

FIG. 5
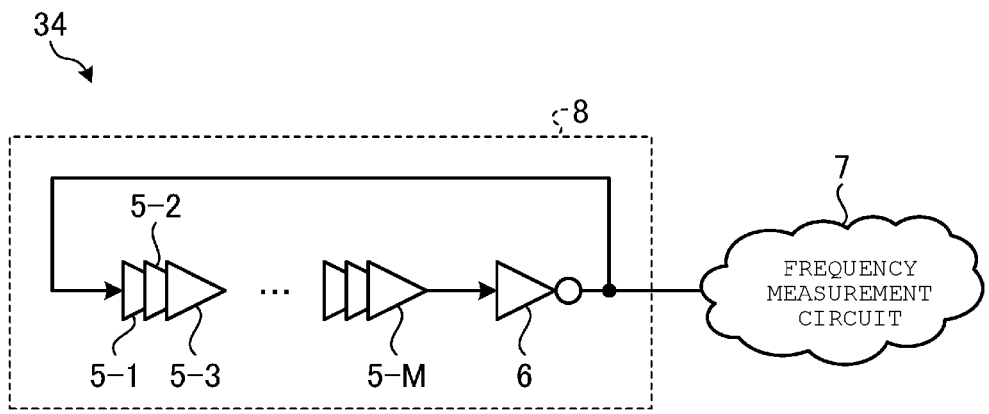
FIG. 6A
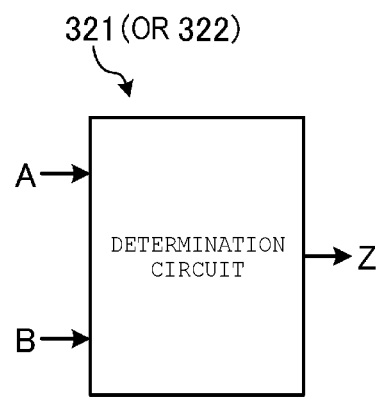
FIG. 6B
| A | B | Z |
|---|---|---|
| 0 | 0 | 0 |
| 0 | 1 | 1 |
| 1 | 0 | 1 |
| 1 | 1 | 0 |

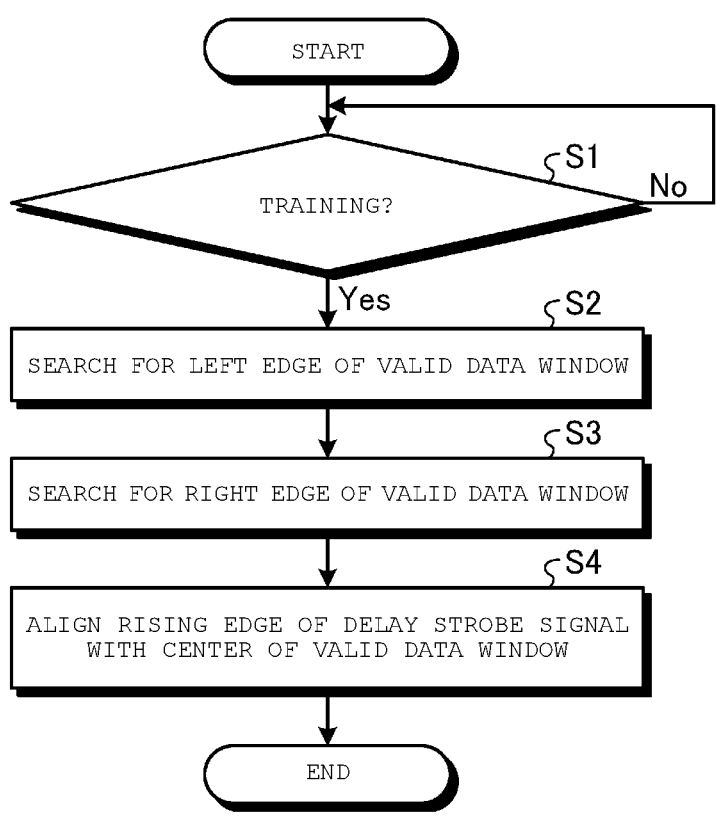

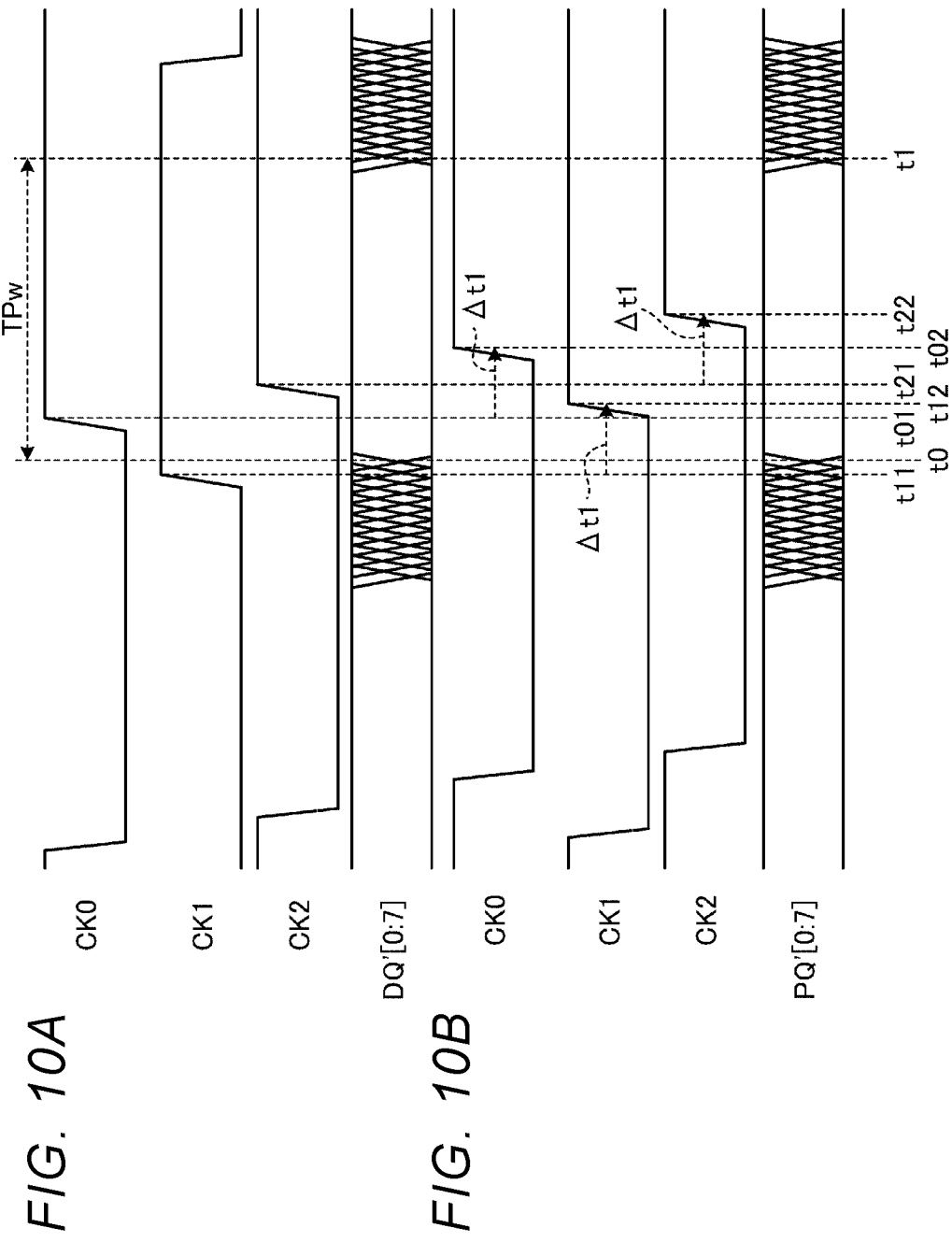

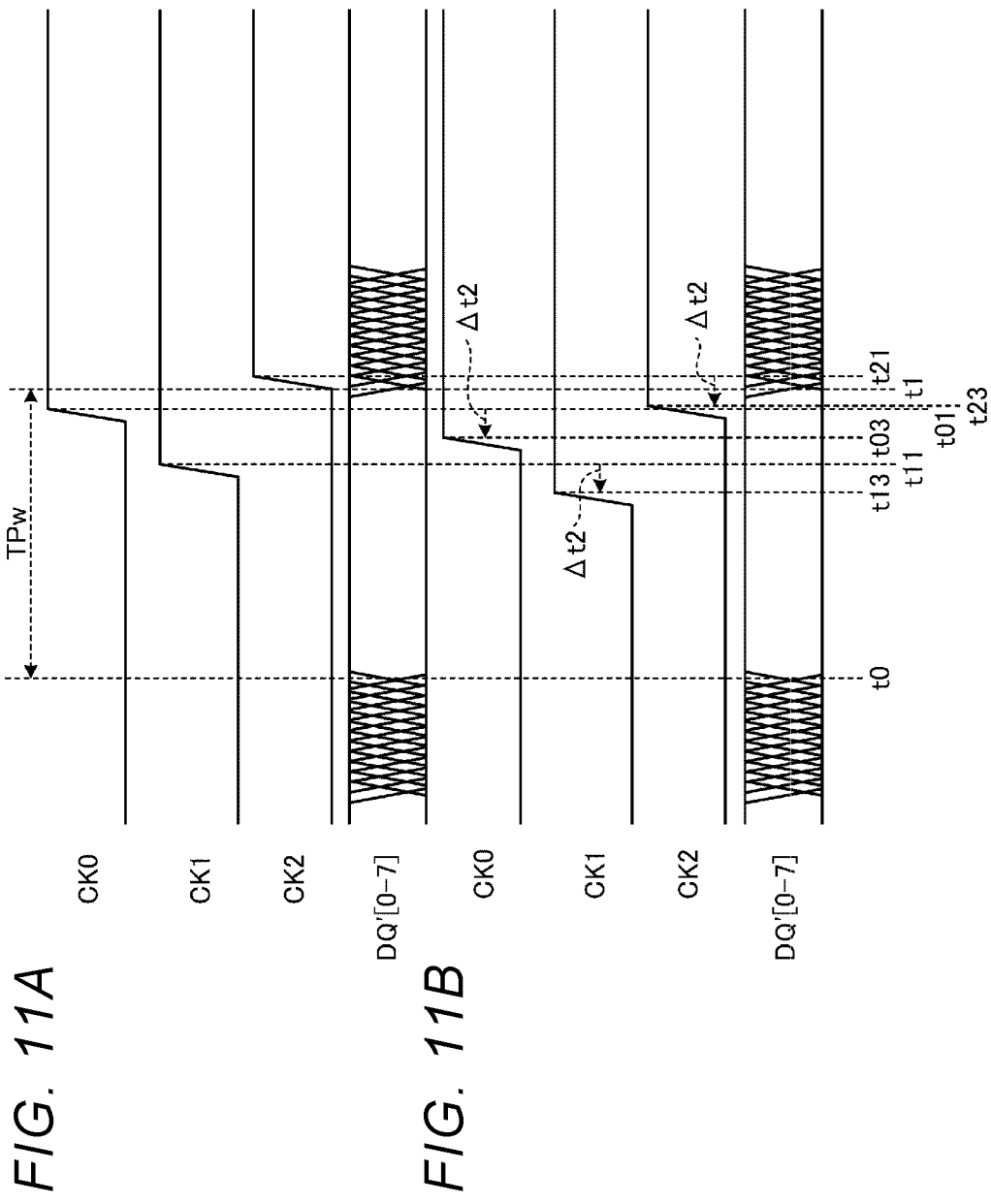

MEMORY SYSTEM AND DELAY CONTROL METHOD

CROSS-REFERENCE TO RELATED APPLICATION

This application is based upon and claims the benefit of priority from Japanese Patent Application No. 2021-047534, filed Mar. 22, 2021, the entire contents of which are incorporated herein by reference.

FIELD

Embodiments described herein relate generally to a memory system and a signal delay control method for a memory system or the like.

BACKGROUND

There is a memory system in which a memory device is connected to a memory interface circuit via a wired communication path. In such a memory system, the memory interface circuit may cause a delay in a data signal and a strobe signal in some cases. In those cases, it is desirable that the delay amount in the data signal and the strobe signal be optimized.

BRIEF DESCRIPTION OF THE DRAWINGS

FIG. 5 depicts a configuration of a training circuit in an embodiment.
FIGS. 6A and 6B are views depicting aspects related to an operation of a determination circuit in an embodiment.
FIG. 9 is a flowchart of a training process in an embodiment.
FIGS. 10A and 10B are waveform views showing a delay control operation in an embodiment.
FIGS. 11A and 11B are waveform views showing a delay control operation in an embodiment.

DETAILED DESCRIPTION

Embodiments provide a memory system and a delay control method which are capable of optimizing a delay amount for a data signal and a strobe signal.

In general, according to one embodiment, a memory system includes a memory device and an interface circuit. The interface circuit is connected to the memory device via a wired communication path. The interface circuit has a first delay circuit, a second delay circuit, a detection circuit, and a control circuit. The first delay circuit applies the delay amount to the data signal to generate a delayed data signal. The second delay circuit generates a first delay strobe signal, a second delay strobe signal, and a third delay strobe signal from a strobe signal synchronized to the data signal. The first delay strobe signal is the strobe signal delayed by a first delay amount. The second delay strobe signal is the strobe signal delayed by a second delay amount. The second delay amount is less than the first delay amount. The third delay strobe signal the strobe signal delayed by a third delay amount. The third delay amount is a delay amount larger than the first delay amount. The detection circuit detects a drift in a timing of the first delay strobe signal with respect to the delayed data signal by using the delayed data signal, the first delay strobe signal, the second delay strobe signal, and the third delay strobe signal. The control circuit adjusts the first delay amount, the second delay amount, and the third delay amount in a direction compensating for the detected drift.

A memory system according to certain example embodiments will be described with reference to the accompanying drawings. The present disclosure is not limited to the example embodiments.

Figure 1:
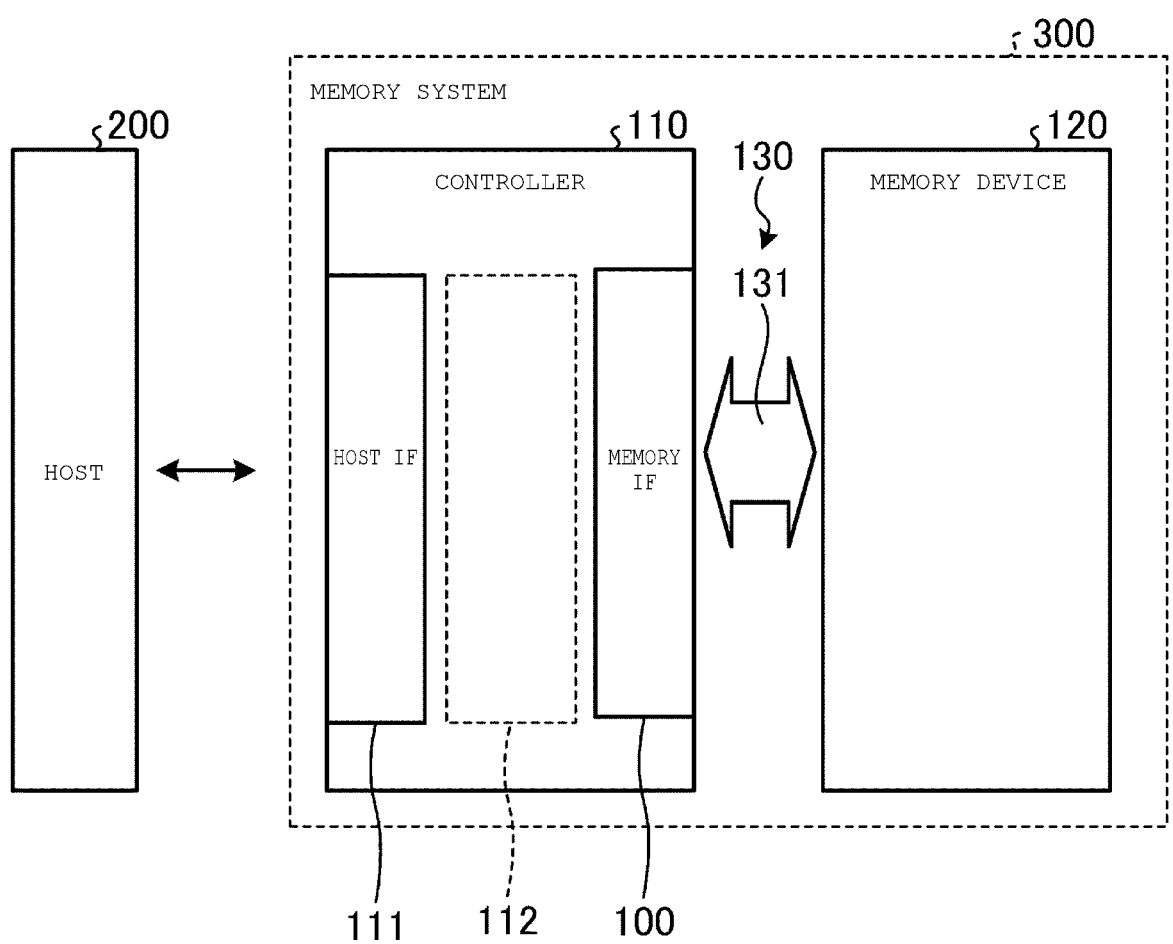
FIG. 1 depicts a memory system according to an embodiment.

A memory system according to an embodiment includes a memory device and a memory interface circuit. The memory interface circuit is a circuit that can be used for accessing the memory device in a parallel manner (e.g., multiple channel can be accessed in parallel). The memory system can be configured as shown in FIG. 1, for example. In particular, FIG. 1 is a view showing a configuration of a memory system 300 according to an embodiment.

The memory system 300 can be connected to a host 200 and can function as an external storage medium of the host 200. For example, the host 200 is a personal computer, and the memory system 300 is a solid-state drive (SSD). The memory system. 300 has a controller 110 and a memory device 120. The controller 110 is connected to the memory device 120 via a wired communication path 130. The controller 110 has a host interface circuit 111, a signal processing circuit 112, and a memory interface circuit 100.

The wired communication path 130 includes a bus wiring 131. The memory interface circuit 100 is connected to the memory device 120 via the bus wiring 131. The bus wiring 131 has a multi-bit width. In accordance therewith, the memory interface circuit 100 is configured for accessing the memory device 120 in a parallel manner. The memory interface circuit 100 will be referred to as a memory interface 100 (or memory IF 100). The host interface circuit 111 accesses the host 200 in a serial manner.

The memory device 120 may be a volatile semiconductor memory (for example, DRAM) or a nonvolatile semiconductor memory (for example, a NAND flash memory).

The memory interface 100 is disposed between an internal circuit (for example, the signal processing circuit 112) of the controller 110 and the memory device 120, and performs interface operations between the internal circuit and the memory device 120. The memory interface 100 transmits data supplied from the internal circuit to the memory device 120, or transfers data received from the memory device 120 to the internal circuit.

For example, the memory interface 100 performs a training process to adjust an intentional delay amount applied to a data signal and/or a strobe signal so that an edge of the strobe signal is near a center of a period during which a level of the data signal is stable (valid data window). Through the training process, a timing margin for the data signal can be secured, and in subsequent communications, data in the signal can properly be captured in synchronization with the strobe signal by an internal circuit at a transfer destination.

That is, when a skew or offset in the strobe signal can properly be managed in the memory interface 100, the memory interface 100 can properly be operated in accordance with a timing design. In this manner, accuracy of the strobe signal can be secured, and requirements for providing of an extra timing margin can be reduced. Accordingly, a circuit size can generally be reduced, and any accompanying power increase can be suppressed.

However, when a temperature fluctuates and/or a power supply voltage fluctuates after the training process has already been performed, the timing of the data signal and/or the strobe signal may drift, and the timing margin may decrease in some cases.

It is conceivable to perform a retraining process by simply interrupting communication signal processing with the memory device 120. In this manner, the timing margin can be secured again. However, there is a possibility that the effective bandwidth of the communication may decrease due to frequent interruption of communication signal processing.

Therefore, according to the present embodiment, the memory interface 100 detects the drift in the timing of the strobe signal with respect to the data signal, and adjusts the delay amount of the strobe signal compensate for the detected drift. In this manner, while the communication signal processing with the memory device 120 can be continuously performed, the securing of timing margin is still achieved.

Specifically, the memory interface 100 applies the delay amount to the data signal received from the memory device 120 to generate a delay data signal. From the strobe signal nominally synchronized to the data signal, the memory interface 100 generates a first delay strobe signal delayed by a first delay amount, a second delay strobe signal delayed by a second delay amount that is smaller than the first delay amount, and a third delay strobe signal delayed by a third delay amount that is larger than the first delay amount. The memory interface 100 detects the drift in the timing of the first delay strobe signal with respect to the delay data signal by using the delay data signal, the first delay strobe signal, the second delay strobe signal, and the third delay strobe signal. When the drift is detected, the memory interface 100 adjusts the first delay amount, the second delay amount, and the third delay amount in a direction corresponding to the drift (for example, a direction in which influence of the drift is mitigated). That is, the memory interface 100 detects that the timing margin of the first delay strobe signal decreases due to the drift and shifts a phase of the first delay strobe signal by a small amount before a complete failure in the data transfer occurs. In this manner, it is possible to secure the timing margin for setting up and holding the data signal while the communication with the memory device 120 is still being continuously performed.

Figure 2:
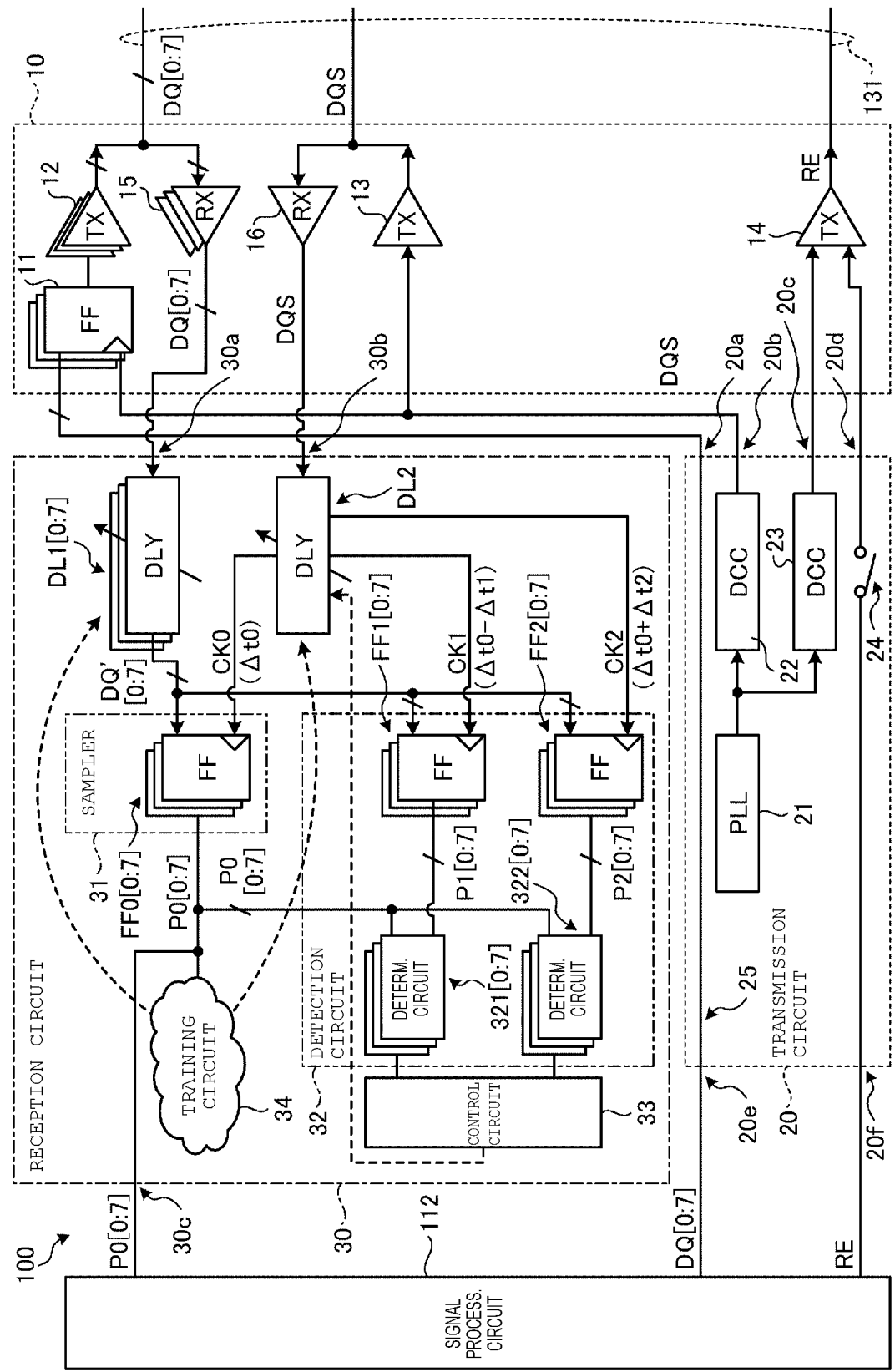
FIG. 2 depicts a configuration of a memory interface in an embodiment.

More specifically, the memory interface 100 can be configured as shown in FIG. 2.

The memory interface 100 has an IO circuit 10, a transmission circuit 20, and a reception circuit 30.

The IO circuit 10 has flip-flops 11, output buffers 12, an output buffer 13, and an output buffer 14, input buffers 15, and an input buffer 16. A flip-flop 11, an output buffer 12, and an input buffer 15 are provided for a data signal DQ [0:7], which has a plurality of bits (e.g., eight bits in the present example). The output buffer 13 and the input buffer 16 correspond to a strobe signal DQS. The output buffer 14 corresponds to a read enable signal RE. The flip-flops 11, the output buffers 12 to 14, and the input buffers 15 and 16 are connected to the memory device 120 via a bus wiring 131 having a multi-bit width, thereby configuring a parallel interface.

Each of the flip-flop 11 has a data input node connected to an output node 20a of the transmission circuit 20, a clock node connected to an output node 20b of the transmission circuit 20, and an output node connected to the output buffer 12.

Each of the output buffer 12 has an input node connected to the flip-flop 11 and an output node connected to the bus wiring 131.

The output buffer 13 has an input node connected to the output node 20b of the transmission circuit 20, and an output node connected to the bus wiring 131.

The output buffer 14 has an input node connected to output nodes 20c and 20d of the transmission circuit 20, and an output node connected to the bus wiring 131.

The transmission circuit 20 includes a Phased Locked Loop (PLL) circuit 21, a Duty Correction Circuit (DCC) 22, a Duty Correction Circuit (DCC) 23, a switch 24, and a signal line 25. The PLL circuit 21 has an output node connected to the DCC 22 and the DCC 23. The DCC 22 has an input node connected to the PLL circuit 21, and an output node connected to the output node 20b. The DCC 23 has an input node connected to the PLL circuit 21, and an output node connected to the output node 20c. The switch 24 has a first end connected to an input node 20f, and a second end connected to the output node 20d. The signal line 25 has a first end connected to an input node 20e, and a second end connected to the output node 20a.

The transmission circuit 20 transfers the data signal DQ [0:7] received from the signal processing circuit 112 to the flip-flops 11. The data signal DQ [0:7] transmitted by the transmission circuit 20 may be a command such as a read command or a write command or may be data such as write data. The transmission circuit 20 generates an oscillation signal in the PLL circuit 21, adjusts a duty ratio thereof in the DCC 22, generates the strobe signal DQS, and transfers the strobe signal DQS to the flip-flops 11. Each flip-flop 11 holds an individual data signal DQ [0:7] in synchronization with the strobe signal DQS. The output buffer 12 transmits the data signal DQ [0:7] output from the flip-flop 11 to the memory device 120 via the bus wiring 131. The output buffer 13 transmits the strobe signal DQS received from the transmission circuit 20 to the memory device 120 via the bus wiring 131.

The transmission circuit 20 generates the oscillation signal in the PLL circuit 21, adjusts a duty ratio thereof in the DCC 23, generates the read enable signal RE, and transfers the read enable signal RE to the output buffer 14. Alternatively, when the read enable signal RE is to be received from the signal processing circuit 112, the transmission circuit 20 turns on (closes) the switch 24, and thus transfers the incoming read enable signal RE to the output buffer 14. In this case, the transmission circuit 20 may stop operation of the DCC23. The output buffer 14 transmits the read enable signal RE to the memory device 120 via the bus wiring 131.

In each of the input buffers 15, an input node is connected to the bus wiring 131, and an output node is connected to an input node 30a of the reception circuit 30. In the input buffer 16, an input node is connected to the bus wiring 131, and an output node is connected to an input node 30b of the reception circuit 30.

The input buffers 15 transmit the data signal DQ [0:7] received via the bus wiring 131 from the memory device 120 to the reception circuit 30. The input buffer 16 transmits the strobe signal DQS received via the bus wiring 131 from the memory device 120 to the reception circuit 30.

The reception circuit 30 has a plurality of delay circuits DL1 [0:7], a delay circuit DL2, a sampler 31, a detection circuit 32, a control circuit 33, and a training circuit 34.

The delay circuits DL1 [0:7] are connected between the input node 30a and the sampler 31. The delay circuits DL1 [0:7] correspond to the data signal DQ [0:7] that has a plurality of bits (eight bits in this example). The data signal DQ [0:7] received by the reception circuit 30 may be data such as read data or may be a command response such as a write completion notification. When the data signal DQ [0:7] is received from the IO circuit 10, each of the individual delay circuits DL1 (0 to 7) applies a delay amount to the individual corresponding data signal DQ (0 to 7), thereby generating a delay data signal DQ'.

Figure 3:
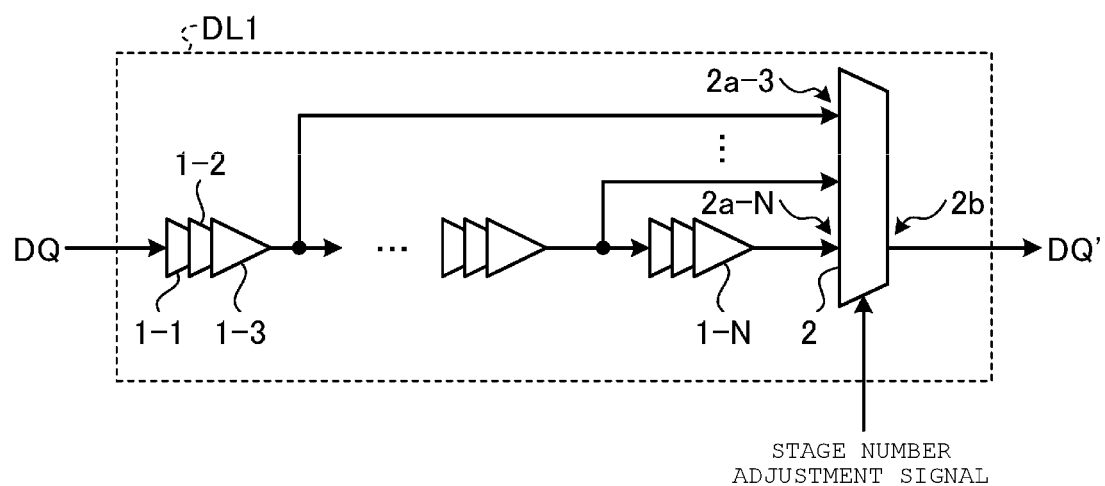
FIG. 3 depicts a configuration of a delay circuit for a data signal in an embodiment.

For example, each of delay circuits DL1 can be configured as shown in FIG. 3. FIG. 3 is a view showing a configuration of the delay circuit DL1 for a data signal DQ. The delay circuit DL1 has a plurality of unit delay elements 1-1 to 1-N (where N is an integer of 3 or more) and a multiplexer 2 between the input node and the output node. The unit delay elements 1-1 to 1-N are, in this example, arranged into a plurality of stages (e.g., groups of three unit delay elements) that are each connected in series between the input node and the multiplexer 2. The multiplexer 2 selects and outputs the data output from one of the different stages including any of the unit delay elements 1-1 to 1-N. The multiplexer 2 has a plurality of input nodes 2a-3 to 2a-N and an output node 2b. The input nodes 2a-3 to 2a-N are respectively connected to the output nodes of different stages including any of the unit delay elements 1-3 to 1-N.

The delay amount of each unit delay element (1-1 to 1-N) is set as toll, and, for present purposes, any delay amount caused by the multiplexer 2 can be ignored since typically this delay amount is sufficiently smaller than the delay amount of the unit delay elements (1-1 to 1-N). Each of the plurality of input nodes 2a-3 to 2a-N receives respectively a delay data signal to which a delay amount of $3 \times td_1$ to $N \times td_1$ is applied. The multiplexer 2 selects any one of the input nodes 2a-3 to 2a-N, and connects the selected one to the output node 2b in accordance with a stage number adjustment signal received from the training circuit 34 or the control circuit 33. The multiplexer 2 selects a delay data signal to which a delay amount of $P \times td1$ (where P is an integer of 3 or more to N) is applied to the data signal DQ, in accordance with the received stage number adjustment signal, and outputs the signal as a delay data signal DQ'.

In FIG. 3, a case where a minimum delay amount that can be applied by the delay circuit DL1 is $3 \times td_1$ is shown as an example. However, the minimum delay amount may be $2 \times td_1$ or smaller, and may be $4 \times td_1$ or larger.

In this manner, the delay amount applied by each of the delay circuits DL1 can be adjusted in accordance with the stage number adjustment signal received from the training circuit 34 or the control circuit 33. Each of the delay circuits DL1 may be adjusted to the delay amounts different from each other. As shown in FIG. 2, the plurality of delay circuits DL1 [0:7] supply a plurality of bits of delay data signal DQ'[0:7] to the sampler 31 and the detection circuit 32.

The delay circuit DL2 is connected between the input node 30b, and the sampler 31 and the detection circuit 32. The delay circuit DL2 corresponds to the strobe signal DQS. When the delay circuit DL2 receives the strobe signal DQS from the IO circuit 10, the strobe signal DQS is delayed by a delay amount Δt0, thereby generating a delay strobe signal CK0. The delay amount Δt0 is a reference delay amount and is a positive delay amount. The delay circuit DL2 supplies the delay strobe signal CK0 to the sampler 31.

In addition, the delay circuit DL2 delays the strobe signal DQS by a delay amount Δt0−Δt1, thereby generating a delay strobe signal CK1. The delay amount Δt1 is a difference delay amount and is a positive delay amount. The delay amount Δt0−Δt1 is a delay amount smaller than the delay amount Δt0. That is, the delay strobe signal CK1 is a signal having a smaller delay amount than the delay strobe signal CK0 and having a more advanced phase. The delay circuit DL2 supplies the delay strobe signal CK1 to the detection circuit 32.

The delay circuit DL2 delays the strobe signal DQS by a delay amount of Δt0+Δt2, thereby generating a delay strobe signal CK2. The delay amount Δt2 is a difference delay amount, and is a positive delay amount. The delay amount Δt0+Δt2 is a delay amount larger than the delay amount Δt0. That is, the delay strobe signal CK2 is a signal having a larger delay amount than the delay strobe signal CK0 and having a more delayed phase. The delay circuit DL2 supplies the delay strobe signal CK2 to the detection circuit 32.

Here, the difference Δt1 between the delay amount of the delay strobe signal CK1 and the delay amount of the delay strobe signal CK0 may be a fixed amount. The difference Δt2 between the delay amount of the delay strobe signal CK0 and the delay amount of the delay strobe signal CK2 may likewise be a fixed amount.

In addition, if a timing margin for signal setting up tends to be tighter than a timing margin for signal holding, the difference delay amounts Δt1 and Δt2 may satisfy a relationship of Equation 1:

$$\Delta t1 > \Delta t2 \qquad \text{(Equation 1)}$$

Figure 4:
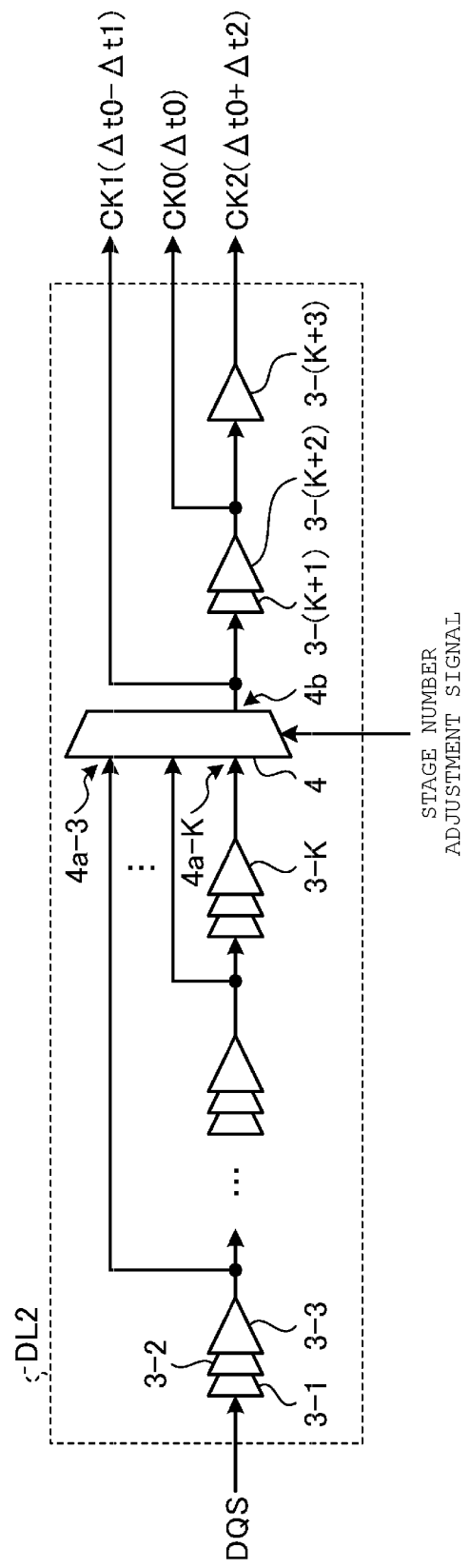
FIG. 4 depicts a configuration of a delay circuit fora strobe signal in an embodiment.

For example, the delay circuit DL2 can be configured as shown in FIG. 4. FIG. 4 is a view showing a configuration of the delay circuit DL2 for the strobe signal DQS. The delay circuit DL2 has a plurality of unit delay elements 3-1 to 3-(K+3) (where K is an integer of 3 or more) and a multiplexer 4 between the input node and the output node. The unit delay elements 3-1 to 3-K are connected in series between the input node and the multiplexer 4. The unit delay elements 3-(K+1) to 3-(K+3) are connected in series between the multiplexer 4 and the output node. The multiplexer 4 selects and outputs the strobe signals output from the unit delay elements 3-K at different stages along the series-connected unit delay elements 3-1 to 3-K. The multiplexer 4 has a plurality of input nodes 4a-3 to 4a-K and an output node 4b. The plurality of input nodes 4a-3 to 4a-K are respectively connected to the output nodes of the unit delay elements 3-3 to 3-K.

The delay amount of each unit delay element (3-1 to 3-K) may be the same as the delay amount of each unit delay element (1-1 to 1-N) (refer to FIG. 3). The delay amount of each unit delay element 3-K is set as $td_3$, and the delay amount caused by the multiplexer 4 can be ignored since the delay amount is sufficiently smaller than the delay amount of the unit delay elements (3-1 to 3-K). Each of the plurality of input nodes 4a-3 to 4a-K receives respectively a delay data signal to which a delay amount of $3 \times td_3$ to $K \times td_3$ is applied. The multiplexer 4 selects any one of the input nodes 4a-3 to 4a-K, and connects the selected one to the output node 4b in accordance with a stage number adjustment signal received from the training circuit 34 or the control circuit 33. The multiplexer 4 selects a delay strobe signal in which a delay amount of $Q \times td_3$ (where Q is an integer of 3 or more to K) is applied to the strobe signal DQS, in accordance with the received stage number adjustment signal, outputs the delay strobe signal from the delay circuit DL2 as the delay strobe signal CK1, and supplies the delay strobe signal CK1 to the unit delay element 3-(K+1). The unit delay elements 3-(K+1) and 3-(K+2) of two stages add a delay amount of $2 \times td_3$ to the delay strobe signal CK1. In accordance with the stage number adjustment signal received from the training circuit 34 or the control circuit 33, the multiplexer 4 and the unit delay elements 3-(K+1) and 3-(K+2) output the delay strobe signal in which a delay amount of $(Q+2) \times td_3$ is applied to the strobe signal DQS, from the delay circuit DL2 as the delay strobe signal CK0, and supply the delay strobe signal to the unit delay element 3-(K+3). The unit delay element 3-(K+3) adds a delay amount of $2 \times td_3$ to the delay strobe signal CK1. In accordance with the received stage number adjustment signal, the multiplexer 4 and the unit delay elements 3-(K+1) to 3-(K+3) output the delay strobe signal in which a delay amount of $(Q+3) \times td_3$ is applied to the strobe signal DQS, from the delay circuit DL2 as the delay strobe signal CK2.

In a case of FIG. 4, the delay amount of the delay strobe signal CK1 is expressed by Equation 2:

$$\Delta t0 - \Delta t1 = Q \times td_3 \quad \text{(Equation 2)}$$

The delay amount of the delay strobe signal CK0 is expressed by Equation 3:

$$\Delta t0 = (Q+2) \times td_3 \quad \text{(Equation 3)}$$

The delay amount of the delay strobe signal CK2 is expressed by Equation 4:

$$\Delta t0 + \Delta t2 = (Q+3) \times td_3 \quad \text{(Equation 4)}$$

As shown in Equations 2 to 4, the difference $\Delta t1$ between the delay amount of the delay strobe signal CK1 and the delay amount of the delay strobe signal CK0 is the difference in the number the unit delay elements through which the respective signal passes therethrough, and in a case of FIG. 4, the difference corresponds to the total delay amount caused by two unit delay elements (two stages). The difference $\Delta t2$ between the delay amount of the delay strobe signal CK0 and the delay amount of the delay strobe signal CK2 is the difference in the number of the unit delay elements the signal passes through, and in the case of FIG. 4, the difference corresponds to the total delay amount of the unit delay elements in a single stage. Therefore, the difference $\Delta t1$ and the difference $\Delta t2$ are respectively fixed quantities as shown in Equation 5:

$$\Delta t1 = 2 \times td_3, \Delta t2 = td_3 \quad \text{(Equation 5)}$$

As shown in Equation 5, the difference $\Delta t1$ between the delay amount of the delay strobe signal CK1 and the delay amount of the delay strobe signal CK0 and the difference $\Delta t2$ between the delay amount of the delay strobe signal CK0 and the delay amount of the delay strobe signal CK2 satisfy Equation 1.

In FIG. 4, a case where a minimum delay amount that can be applied by the delay circuit DL2 is $3 \times td_3$ is illustrated as an example. However, the minimum delay amount may be $2 \times td_3$ or smaller, and may be $4 \times td_3$ or larger. In addition, a case where $\Delta t1$ is $2 \times td_3$ and $\Delta t2$ is $td_3$ is illustrated as an example. However, when Equation 1 is satisfied, $\Delta t1$ may be $3 \times td_3$ or larger, and $\Delta t2$ may be $2 \times td_3$ or larger.

As shown in FIG. 2, the sampler 31 is connected between the plurality of delay circuits DL1 [0:7] and the delay circuit DL2 on one side and the training circuit 34, the output node 30c, and the detection circuit 32 on the other. The sampler 31 has a plurality of flip-flops FF0 [0:7]. The plurality of flip-flops FF0 [0:7] correspond to the plurality of delay circuits DL1 [0:7], and correspond to a delay data signal DQ' [0:7] that has a plurality of bits (eight bits in this example). Each of the flip-flops FF0 receives the corresponding delay data signal DQ' from the corresponding delay circuit DL1 [0:7], and receives the delay strobe signal CK0 from the delay circuit DL2. Each of the flip-flops FF0 samples the delay data signal DQ' in synchronization with the delay strobe signal CK0. As a sampling result, the plurality of flip-flops FF0 [0:7] outputs data signal P0 [0:7] that has a plurality of bits (e.g., eight bits in the present example) to each of the training circuit 34, the output node 30c, and the detection circuit 32.

When the memory system 300 starts, the training circuit 34 performs training process for adjusting the delay amount of the plurality of delay circuits DL1 [0:7] and delay circuits DL2 so that an edge timing of the delay strobe signal CK0 is near the center of the valid data window of the delay data signal DQ' [0:7].

The training circuit 34 has a replica oscillation circuit 8 and a frequency measurement circuit 7 as shown in FIG. 5. The replica oscillation circuit 8 has unit delay elements 5-1 to 5-M (where M is an integer of 2 or more) and an inverter 6. The unit delay elements 5-1 to 5-M are connected in series with the inverter 6 and in a ring shape, and function as a ring oscillator. The input node of the inverter 6 is connected to the output node of the unit delay element 5-M (the final unit delay element in the series). The output node of the inverter 6 is connected to the input side of the unit delay element 5-1 (the first unit delay element in the series) and also the frequency measurement circuit 7.

The delay amount of each unit delay element 5-1 to 5-M may be the same as the delay amount of the unit delay elements 1-N and 3-K (refer to FIGS. 3 and 4). The delay amount of the unit delay elements 5-M is set as $td_5$, and the delay amount by the inverter 6 can be ignored in this context, since the delay amount is sufficiently smaller than the delay amount of the unit delay elements 5-M. In this case, an oscillation frequency F of the replica oscillation circuit 8 is expressed by Equation 6:

$$F = 1/(td_5 \times M \times 2) \quad \text{(Equation 6)}$$

As shown in Equation 6, the training circuit 34 causes the frequency measurement circuit 7 to measure an oscillation frequency F of the replica oscillation circuit 8. In this manner, the training circuit 34 can obtain a delay amount $td_5$ of one of the unit delay elements 5-M, and can then calculate the number of the unit delay elements 1-N and 3-K (stages) that need to be adjusted for obtaining a desired delay amount. When the training process is performed, the training circuit 34 generates a stage number adjustment signal in accordance with a calculation result thereof, and supplies the stage number adjustment signal to each of the delay circuits DL1 [0:7] and DL2.

In addition, as shown in Equation 6, the frequency measurement circuit 7 measures the oscillation frequency F of the replica oscillation circuit 8. In this manner, the training circuit 34 can detect fluctuations in the delay amount $td_5$ of the unit delay elements 5-M which are caused by drift. When the fluctuations in the measured frequency exceed a permissible range, the edge timing of the previously trained delay strobe signal CK0 deviates from the center of the valid data window of the delay data signal DQ'[0:7], and thus, the sampling cannot normally be performed.

Here, it is assumed that a retraining process is performed in the training circuit 34 in response to occurrence of the drift. An oscillation frequency F' of the replica oscillation circuit 8 that fluctuates due to the drift is expressed by Equation 7 (below). In this manner, the training circuit 34 can recognize a change amount k of the delay of the unit delay elements. Equation 7 shows that the oscillation frequency F' is measured after being changed to 1/k of the oscillation frequency F in Equation 6. In Equation 7, $td_5$ in Equation 6 is replaced with $k \times td_5$. The training circuit 34 can recognize that the delay amount is changed to k times in response to the oscillation frequency changed to 1/k times.

$$F'=1/(k \times td_5 \times M \times 2) \quad \text{(Equation 7)}$$

In order to correct the delay amount from the change of the oscillation frequency of the replica oscillation circuit 8, it is conceivable that the training circuit 34 could set the number of stages for each of the delay circuits DL1 [0:7] and DL2 to 1/k, and calculate the number of stages to be changed.

However, in a case where the current number of stages of each of the delay circuits DL1 [0:7] and DL2 is set as 1/k, the total number of stages cannot always be realized as an integer value. Therefore, the following is also conceivable. For each of the delay circuits DL1 [0:7] and DL2, the size of the delay amounts $td1$ and $td_3$ of the unit delay element is reduced, and the number of stages is increased so that the total number of stages is close to the integer that would result if the current number of stages was set as 1/k. When the size of the unit delay element is reduced, the delay amounts $td_1$ and $td_3$ may vary due to influence of manufacturing variations, and it is difficult to satisfy the accuracy required for the delay circuits DL1 [0:7] and DL2. Also, when the number of stages is increased, a circuit area may increase, and costs of the delay circuits DL1 [0:7] and DL2 may increase. In addition, when the number of stages is increased, power consumption of the delay circuits DL1 [0:7] and DL2 may increase, and power consumption of the memory interface 100 may increase.

During a retraining period, it is conceivable in other examples that the signal processing circuit 112 interrupts signal processing for communication with the memory device 120. In this case, the signal processing circuit 112 stops the signal processing for transmission, and does not supply a signal for transmission to the memory interface 100. Alternatively, the signal processing circuit 112 stops the signal processing for reception, and even when a signal for reception (that is, the data signal P0 [0:7] having the plurality of bits) is received from the memory interface 100, the signal processing circuit 112 discards the signal. In this manner, the controller 110 interrupts the signal processing for the communication with the memory device 120. Accordingly, there is a possibility that an effective communication bandwidth may decrease.

In contrast, the memory interface 100 shown in FIG. 2 does not perform the retraining process in the training circuit 34 in this manner. Rather the detection circuit 32 detects the drift in the timing of the strobe signal with respect to the data signal, and based on the detection result, the control circuit 33 controls the delay circuit DL2 to adjust the delay amount of the strobe signal in a direction to compensate the drift.

The detection circuit 32 detects the drift of the timing of the delay strobe signal CK0 with respect to each of the delay data signals DQ' by using the delay data signal DQ' [0:7] having a plurality of bits, the delay strobe signal CK1, and the delay strobe signal CK2. The detection circuit 32 outputs the detection result to the control circuit 33.

The detection circuit 32 is connected between the plurality of delay circuits DL1 [0:7] and delay circuits DL2, and the control circuit 33. The detection circuit 32 has a plurality of flip-flops FF1 [0:7], a plurality of flip-flops FF2 [0:7], a determination circuit 321, and a determination circuit 322.

The plurality of flip-flops FF1 [0:7] correspond to the plurality of delay circuits DL1 [0:7] and the multi-bit delay data signals DQ' [0:7]. When the delay data signals DQ' [0:7] and the delay strobe signal CK1 are received, each of the flip-flops FF1 samples the corresponding delay data signal DQ' in synchronization with the delay strobe signal CK1. The plurality of flip-flops FF1 [0:7] output the data signals P1 [0:7] to a plurality of determination circuits 321 [0:7] as a sampling result.

The plurality of flip-flops FF2 [0:7] correspond to the plurality of delay circuits DL1 [0:7] and the delay data signals DQ' [0:7]. When the delay data signals DQ' [0:7] and the delay strobe signal CK2 are received, each of the flip-flops FF2 samples the corresponding delay data signal DQ' in synchronization with the delay strobe signal CK2. The plurality of flip-flops FF2 [0:7] output the data signals P2 [0:7] to a plurality of determination circuits 322 [0:7] as a sampling result.

The plurality of determination circuits 321 [0:7] correspond to the plurality of flip-flops FF0 [0:7] and the plurality of flip-flops FF1 [0:7]. Each of the individual determination circuits 321 determines a mismatch between a logic level of the data signal P0 received from the corresponding flip-flop FF0 and a logic level of the data signal P1 received from the corresponding flip-flop FF1. When the logic level of the data signal P0 and the data signal P1 do not match each other, the determination circuits 321 output a logic level (for example, "1") indicating the occurrence of a mismatch to the control circuit 33 as a determination result. When the logic level of the data signal P0 and the data signal P1 match each other, the determination circuits 321 output a logic level (for example, "0") indicating that there is no mismatch to the control circuit 33 as a determination result.

The plurality of determination circuits 322 [0:7] correspond to the plurality of flip-flops FF0 [0:7] and the plurality of flip-flops FF2 [0:7]. Each of the determination circuit 322 determines a mismatch between the logical level of the data signal P0 received from the corresponding flip-flop FF0 and a logical level of the data signal P2 received from the corresponding flip-flop FF2. When the logic level of the data signal P0 and the data signal P2 do not match each other, each of the determination circuits 322 outputs a logic level (for example, "1") indicating the occurrence of the mismatch to the control circuit 33 as the determination result. When the logic level of the data signal P0 and the data signal P2 match each other, each of the determination circuits 322 outputs a logic level (for example, "0") indicating that there is no mismatch to the control circuit 33 as the determination result.

For example, each of the determination circuits 321 (each of the determination circuits 321 [0] . . . 321 [7]) is operated as shown in FIGS. 6A and 6B. FIGS. 6A and 6B are views showing aspects related to an operation of a determination circuit 321. FIG. 6A is a view showing a definition of input/output signals with respect to the determination circuit 321. FIG. 6B is a truth value table showing the operation of the determination circuit 321. Although the operation of each determination circuit 321 is illustrated in FIGS. 6A and 6B, the operation of each of the determination circuits 322 [0] to 322 [7] is the same as the operation shown in FIGS. 6A and 6B.

As shown in FIG. 6A, the determination circuit 321 receives two input signals A and B, and generates one output signal Z. As shown in FIG. 6B, when the logic levels of the two input signals A and B do not match each other, the determination circuit 321 outputs the output signal Z having the logic level (for example, "1") indicating the occurrence of the mismatch. When the logic levels of the two input signals A and B match each other, the determination circuit 321 outputs the output signal Z having the logic level (for example, "0") indicating the occurrence of the match.

As an internal configuration of each of the determination circuits 321, any desired circuit that performs the operation shown in FIG. 6B on the signal shown in FIG. 6A can be utilized. For example, each of the determination circuits 321 can adopt a configuration shown in one of FIGS. 7A to 7D. Although different internal configurations for the determination circuits 321 are illustrated in each of FIGS. 7A to 7D, in general, the internal configuration of each of the determination circuits 322 in a device will have the same internal configuration.

Figure 7A:
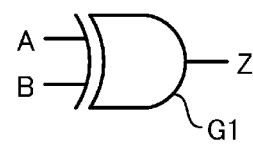
FIGS. 7A to 7D are views showing an internal configuration of a determination circuit in an embodiment.

In FIG. 7A, the determination circuit 321 has an EXOR gate G1. The EXOR gate G1 receives the signal A by a first input node, receives the signal B by a second input node, and outputs the signal Z from an output node. The EXOR gate G1 calculates an exclusive OR of the signal A and the signal B, and outputs the signal Z as a calculation result.

Figure 7B:
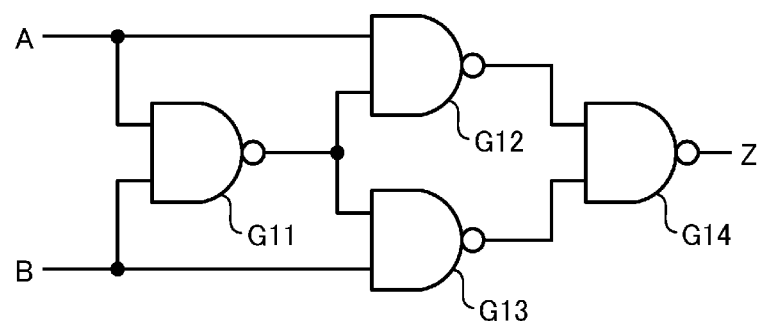

In FIG. 7B, the determination circuit 321 has a plurality of NAND gates G11 to G14 ("NAND" in this context refers to the logical operator). The NAND gate G11 receives the signal A by a first input node, receives the signal B by a second input node, and an output node is connected to the NAND gates G12 and G13. The NAND gate G12 receives the signal A by a first input node, a second input node is connected to the NAND gate G11, and an output node is connected to the NAND gate G14. In the NAND gate G13, a first input node is connected to the NAND gate G11, the signal B is received by a second input node, and an output node is connected to the NAND gate G14. In the NAND gate G12, a first input node is connected to the NAND gate G12, a second input node is connected to the NAND gate G13, and the signal Z is output from an output node. The NAND gate G11 calculates a negative logical product of the signal A and the signal B, and outputs a calculation result to each of the NAND gates G12 and G13. The NAND gate G12 calculates a negative logical product of the signal A and the calculation result of the NAND gate G11, and outputs the calculation result to the NAND gate G14. The NAND gate G13 calculates a negative logical product of the calculation result of the NAND gate G11 and the signal B, and outputs the calculation result to the NAND gate G14. The NAND gate G14 calculates the negative logical product of the calculation result of the NAND gate G12 and the calculation result of the NAND gate G13, and outputs the calculation result as the signal Z.

Figure 7C:
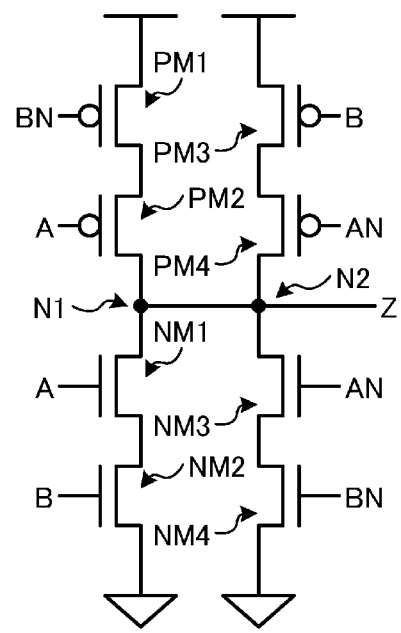

In FIG. 7C, the determination circuit 321 has a plurality of transistors PM1 to PM4 and NM1 to NM4. The transistors PM1, PM2, NM1, and NM2 are connected in series between a power supply potential and a ground potential. The transistors PM3, PM4, NM3, and NM4 are connected in series between the power supply potential and the ground potential. In series connection of the transistors PM1, PM2, NM1, and NM2 and series connection of the transistors PM3, PM4, NM3, and NM4, intermediate nodes N1 and N2 are connected in common.

For example, the transistor PM1 is a PMOS transistor. A source is connected to the power supply potential, a drain is connected to the transistor PM2, and a signal BN is received by a gate. The signal BN is a signal in which the signal B is logically inverted.

For example, transistor PM2 is a PMOS transistor. A source is connected to transistor PM1, a drain is connected to a node N1, and the signal A is received at a gate.

The transistor NM1 is, for example, an NMOS transistor, a source is connected to the transistor NM2, a drain is connected to the node N1, and the signal A is received by a gate.

For example, the transistor NM2 is an NMOS transistor. A source is connected to the ground potential, a drain is connected to the transistor NM1, and the signal B is received by a gate. The signal Z is output from the node N1.

For example, the transistor PM3 is a PMOS transistor. A source is connected to the power supply potential, a drain is connected to the transistor PM4, and the signal B is received by a gate.

For example, the transistor PM4 is a PMOS transistor. A source is connected to transistor PM3, a drain is connected to a node N2, and a signal AN is received by a gate. The signal AN is a signal in which the signal A is logically inverted.

For example, the transistor NM3 is a NMOS transistor. A source is connected to the transistor NM4, a drain is connected to the node N2, and the signal AN is received by a gate.

For example, the transistor NM4 is a NMOS transistor. A source is connected to the ground potential, a drain is connected to the transistor NM3, and the signal BN is received by a gate. The signal Z is output from the node N2.

Figure 7D:
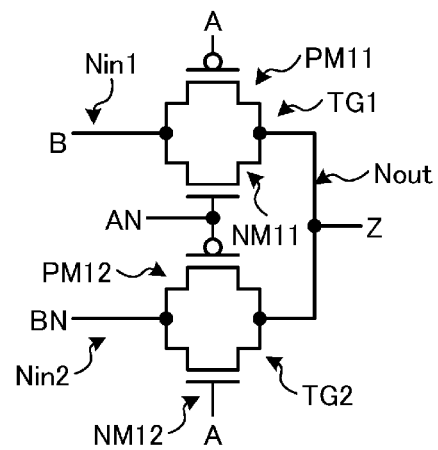

In FIG. 7D, the determination circuit 321 has a plurality of transistors PM11, PM12, NM11, and NM12. In the transistor PM11 and the transistor NM11, a source and the drain are connected in common, thereby configuring a transfer gate TG1. The transfer gate TG1 receives the signal B via an input node, receives the signal A via an inverting gate, receives the signal AN via a non-inverting gate, and outputs the signal Z from an output node.

In the transistor PM12 and the transistor NM12, a source and the drain are connected in common, thereby configuring a transfer gate TG2. The transfer gate TG2 receives the signal BN via an input node, receives the signal AN via an inverting gate, receives the signal A via a non-inverting gate, and outputs the signal Z from an output node.

For example, the transistor PM11 is a PMOS transistor. A source is connected to an input node Nin1 and a drain of the transistor NM11, a drain is connected to an output node Nout, and the signal A is received by a gate.

For example, the transistor NM11 is a NMOS transistor. The drain is connected to the input node Nin1 and the source of the transistor PM11, a source is connected to the output node Nout, and the signal AN is received by a gate.

For example, the transistor PM12 is a PMOS transistor. A source is connected to an input node Nin2 and a drain of the transistor NM12, a drain is connected to the output node Nout, and the signal AN is received by a gate.

For example, the transistor NM12 is a NMOS transistor. The drain is connected to the input node Nin2 and the source of the transistor PM12, a source is connected to the output node Nout, and the signal A is received by a gate. The signal Z is output from the output node Nout.

As shown in FIG. 2, the control circuit 33 is connected between the detection circuit 32 and the delay circuit DL2. When the detection circuit 32 detects the drift, the control circuit 33 controls the delay circuit DL2, and adjusts the delay amounts $\Delta t0$, $\Delta t0-\Delta t1$, and $\Delta t0+\Delta t2$ for each of the delay strobe signals CK0, CK1, and CK2 in a direction corresponding to the drift. That is, the control circuit 33 generates a stage number adjustment signal for adjusting the delay amounts $\Delta t0$, $\Delta t0-\Delta t1$, and $\Delta t0+\Delta t2$ of each of the delay strobe signals CK0, CK1, and CK2 in the direction corresponding to the drift, and supplies the stage number adjustment signal to the delay circuit DL2.

At this time, if the difference delay amounts Δt1 and Δt2 are fixed amounts, the control circuit 33 may change the delay amount Δt0, the delay amount Δt0−Δt1, and the delay amount Δt0+Δt2 by the same change amount for each.

In addition, since a timing margin of setting up tends to be stricter than a timing margin of holding, the difference delay amounts Δt1 and Δt2 may satisfy a relationship of Equation 1. In this case, when the detection circuit 32 detects the drift, the control circuit 33 adjusts each of the delay amount Δt0, the delay amount Δt0−Δt1, and the delay amount Δt0+Δt2, while satisfying the relationship of Equation 1.

For example, the control circuit 33 receives the determination result from the plurality of determination circuits 321 [0:7], and receives the determination result from the plurality of determination circuits 322 [0:7]. Based on the determination result of determination circuits 321 [0:7] and the determination result of determination circuits 322 [0:7], the control circuit 33 controls the delay circuit DL2, and adjusts each of the delay amount Δt0, the delay amount Δt0−Δt1, and the delay amount Δt0+Δt2 in a direction such the mismatch is resolved or reduced.

When the control circuit 33 receives a determination result indicating the occurrence of a mismatch from at least one determination circuit 321 (any one of 321 [0] to 321 [7]) out of the plurality of determination circuits 321 [0:7], the control circuit 33 controls the delay circuit DL2 to increase each of the delay amount Δt0, the delay amount Δt0−Δt1, and the delay amount Δt0+Δt2. In this case, the control circuit 33 may increase the delay amount Δt0, the delay amount Δt0−Δt1, and the delay amount Δt0+Δt2 by Δt1. In this manner, in a case where the timing margin for setting up the delay data signal DQ' is decreased due to the drift, the edge timing of the delay strobe signal CK0 can be shifted by a small amount (for example, Δt1) in a direction closer to the vicinity of the center of the valid data window.

When the control circuit 33 receives the determination result indicating the occurrence of a mismatch from at least one determination circuit 322 (any one of 322 [0] to 322 [7]) out of the plurality of determination circuits 322 [0:7], the control circuit 33 controls the delay circuit DL2 to decrease the delay amount Δt0, the delay amount Δt0−Δt1, and the delay amount Δt0+Δt2. In this case, the control circuit 33 may decrease each of the delay amount Δt0, the delay amount Δt0−Δt1, and the delay amount Δt0+Δt2 by Δt2. In this manner, when the timing margin of holding the delay data signal DQ' is decreased due to the drift, the edge timing of the delay strobe signal CK0 can be shifted by a small amount (for example, Δt2) in the direction closer to the vicinity of the center of the valid data window.

Next, a training process in the memory interface 100 will be described with reference to FIGS. 8A to 8D. FIGS. 8A to 8D are waveform views respectively showing aspects of the training process. In FIGS. 8A to 8D, waveforms of the plurality of delay data signals DQ'[0] to DQ' [7] are superimposed on one another and labeled delay data signal DQ' [0:7]. In FIGS. 8A to 8D, for convenience, an edge on a left side in the waveform of the delay data signal DQ' [0:7] will be referred to as a left edge, and an edge on a right side in the waveform of the delay data signal DQ' [0:7] will be referred to as a right edge.

Figure 8A:
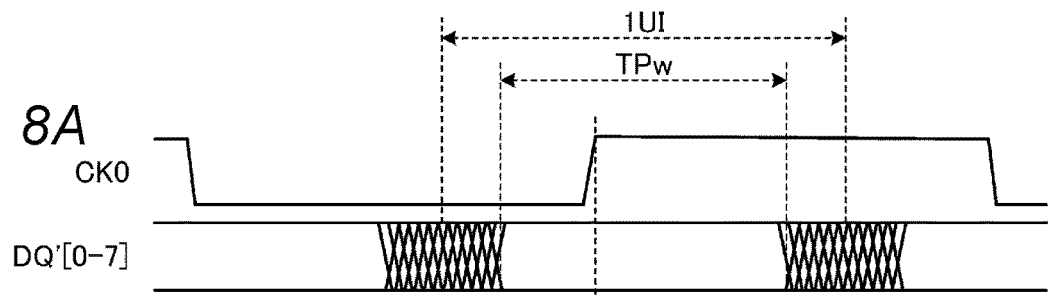
FIGS. 8A to 8D are waveform views of a training process in an embodiment.

As shown in FIG. 8A, for the plurality of delay data signals DQ' [0] to DQ' [7], the timings of the left edges are generally close to each other, but the timings slightly vary. The timings of the right edges are also generally close to each other, but the timings slightly vary as well. This is due to a length of the signal line between the input buffer 15 and the memory device 120 varying for each of the data signals DQ [0:7] or some other characteristic of the memory device 120 varies for the data signals DQ [0:7]. The valid data window TPw of the delay data signal DQ' [0:7] is a period from the latest timing of the left edge out of the plurality of delay data signals DQ' [0] to DQ' [7] to the earliest timing of the right edge out of the plurality of delay data signals DQ' [0] to DQ' [7]. When a unit period of waveform processing corresponding to a half cycle of the delay strobe signal CK0 is set as 1 unit interval (UI), the valid data window TPw of the delay data signal DQ' [0:7] is a period slightly shorter in time than this 1 UI.

In an initial state of the training process, a rising edge timing of the delay strobe signal CK0 is set as a reference timing t0. In many cases, the reference timing t0 deviates from the center of the valid data window TPw of the delay data signal DQ' [0:7]. The training circuit 34 gradually (for example, one stage by one stage) increases the number of stages according to the stage number adjustment signal of the plurality of delay circuits DL1 [0:7], while holding fixed the number of stages adjusted by the stage number adjustment signal of the delay circuit DL2.

Figure 8B:
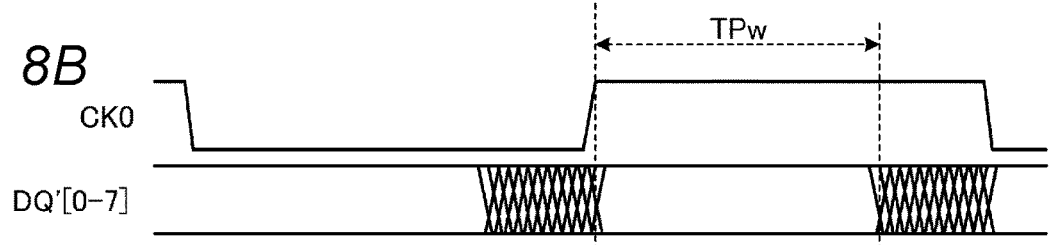

In this manner, as shown in FIG. 8B, the training circuit 34 causes a start timing of the valid data window TPw to match the reference timing t0. The training circuit 34 can determine that the start timing of the valid data window TPw substantially matches the reference timing t0 when the logic level of at least one data signal P0 of the data signals P0 [0:7] is inverted.

Figure 8C:
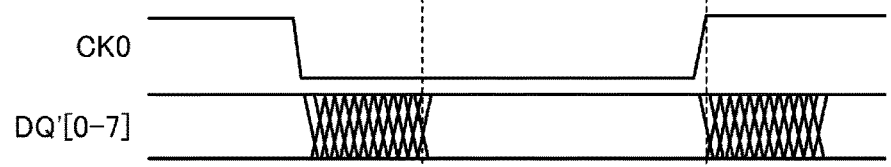

Thereafter, the training circuit 34 gradually (for example, one stage by one stage) increases the number of stages adjusted by the stage number adjustment signal of the delay circuit DL2, while holding fixed the number of stages adjusted by the stage number adjustment signal of the plurality of delay circuits DL1 [0:7]. In this manner, as shown in FIG. 8C, the training circuit 34 causes the rising edge timing of the delay strobe signal CK0 to match an end timing t1 of the valid data window TPw. The training circuit 34 can determine that the rising edge timing of the delay strobe signal CK0 substantially matches the end timing t1 of the valid data window TPw when the logic level of at least one data signal P0 of the data signal P0 [0:7] is inverted.

The training circuit 34 sets the difference between the number of stages adjusted in FIG. 8B and the number of stages adjusted in FIG. 8C as approximately ½ times, and adds the number of stages of the difference set as approximately ½ times to the number of stages adjusted in FIG. 8B, thereby obtaining the number of stages to be adjusted by the delay circuit DL2. The training circuit 34 sets the number of stages adjusted by the stage number adjustment signal of the delay circuit DL2 based of the obtained number of stages, while fixing the number of stages adjusted by the stage number adjustment signal of the plurality of delay circuits DL1 [0:7].

Figure 8D:
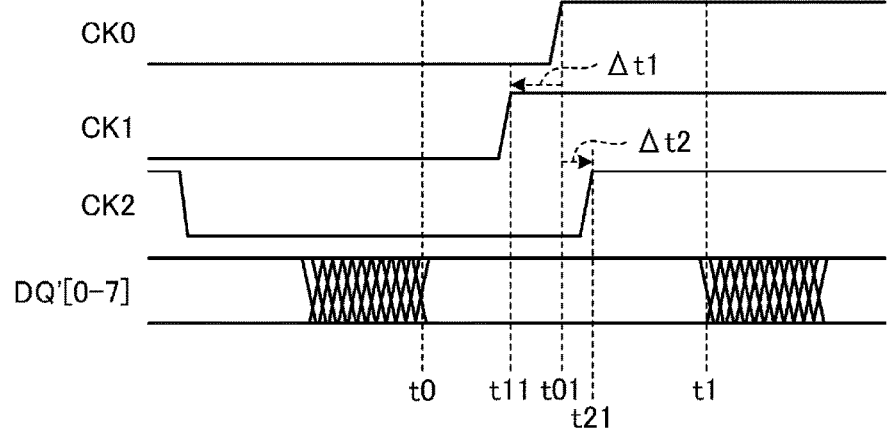

In this manner, as shown in FIG. 8D, the training circuit 34 causes the rising edge timing of the delay strobe signal CK0 to match a timing t01 in the central portion of the valid data window TPw. At the same time, the training circuit 34 causes the rising edge timing of the delay strobe signal CK1 to match a timing t11, which is Δt1 earlier than the timing t01 in the central portion of the valid data window TPw. The training circuit 34 causes the rising edge timing of the delay strobe signal CK2 to match a timing t21, which is Δt2 after the timing t01 in the central portion of the valid data window TPw.

In this case, a delay amount Δt0 of the delay strobe signal CK0 by the delay circuit DL2 corresponds to the delay amount of the timing t01 with respect to the rising edge timing of the strobe signal DQS. Similarly, a delay amount $\Delta t0-\Delta t1$ of the delay strobe signal CK1 by the delay circuit DL2 corresponds to a delay amount obtained by subtracting the difference $\Delta t1$ from the delay amount of the timing t01 with respect to the rising edge timing of the strobe signal DQS, and corresponds to a delay amount of the timing t11 with respect to the rising edge timing of the strobe signal DQS. A delay amount $\Delta t0+\Delta t1$ of the delay strobe signal CK2 by the delay circuit DL2 corresponds to a delay amount obtained by adding the difference $\Delta t2$ to the delay amount of the timing t01 with respect to the rising edge timing of the strobe signal DQS, and corresponds to a delay amount of the timing t21 with respect to the rising edge timing of the strobe signal DQS.

With the state of FIG. 8D achieved, the training circuit 34 ends the training process. In this case, the rising edge timing of the delay strobe signal CK0 is in the central portion of the valid data window TPw. Accordingly, it is possible to easily secure the timing margin for setting up and holding the delay data signal DQ' [0:7] with respect to the delay strobe signal CK0.

Next, a flow of the training process will be described with reference to FIG. 9.

The memory interface 100 waits for a decision to start the training process (No in S1).

When it is time for performing the training process (Yes in S1), the memory interface 100 searches for the left edge of the valid data window TPw of the delay data signal DQ' [0:7] (S2). For example, when the delay amount of the delay data signal DQ' [0:7] is changed while the delay amount of the delay strobe signal CK0 is held fixed, the memory interface 100 causes the rising edge of the delay strobe signal CK0 to approximately match the start timing of the valid data window TPw.

Next, the memory interface 100 searches for the right edge of the valid data window TPw of the delay data signal DQ' [0:7] (S3). For example, when the delay amount of the delay strobe signal CK0 is changed while the delay amount of the delay data signal DQ' [0:7] is held fixed, the memory interface 100 causes the rising edge of the delay strobe signal CK0 to approximately match the end timing of the valid data window TPw.

Next, the memory interface 100 aligns the rising edge of the delay strobe signal CK0 with the center of the valid data window TPw (S4). For example, the memory interface 100 controls the delay amount to be an intermediate delay amount between the delay amount in S2 of the delay strobe signal CK0 and the delay amount in S3 of the delay strobe signal CK0. In this manner, the rising edge of the delay strobe signal CK0 can be aligned with the center of the valid data window TPw. In this case, the memory interface 100 sets the delay amount of the delay strobe signal CK0 with respect to the strobe signal DQS as $\Delta t0$. In this manner, the memory interface 100 can also align the delay strobe signals CK1 and CK2 for detecting the drift within the vicinity of the center of the valid data window TPw. That is, the memory interface 100 delays the strobe signal DQS by the delay amount $\Delta t0$, thereby generating the delay strobe signal CK0. The memory interface 100 delays the strobe signal DQS by the delay amount $\Delta t0-\Delta t1$, thereby generating the delay strobe signal CK1. The memory interface 100 delays the strobe signal DQS by the delay amount of $\Delta t0+\Delta t2$, thereby generating the delay strobe signal CK2.

Next, a delay control operation in a case where the drift occurs in a direction in which the timing margin of the setting up decreases will be described with reference to FIGS. 10A and 10B. FIGS. 10A and 10B are waveform views showing the delay control operation.

When a temperature fluctuates and/or a power supply voltage fluctuates after performing of the training process, the timing of the data signal and/or the strobe signal may again drift from the values when the training process was performed, thereby resulting in a state shown in FIG. 10A. In this case, the timing margin for the setting up decreases.

In the state shown in FIG. 10A, the rising edge timing t11 of the delay strobe signal CK1 deviates from the valid data window TPw, and becomes a timing slightly before the start timing t0 of the valid data window TPw. In this case, the delay strobe signal CK0 approaches the left edge side of the delay data signal DQ' [0:7] from the center of the valid data window TPw, and the timing margin of setting up the delay data signal DQ' [0:7] decreases.

In response thereto, at least one determination circuit 321 out of the plurality of determination circuits 321 [0:7] outputs a logic level (for example, "1") indicating the occurrence of the mismatch, as a determination result, to the control circuit 33. In this case, all of the determination circuits 322 [0:7] output a logic level (for example, "0") indicating the match, as a determination result, to the control circuit 33. The control circuit 33 controls the delay circuit DL2 in response to receiving the determination result indicating the occurrence of the mismatch from at least one determination circuit 321, and increases each of the delay amount $\Delta t0$, the delay amount $\Delta t0-\Delta t1$, and the delay amount $\Delta t0+\Delta t2$. In this case, the control circuit 33 may increase each of the delay amount $\Delta t0$, the delay amount $\Delta t0-\Delta t1$, and the delay amount $\Delta t0+\Delta t2$ by $\Delta t1$.

In this manner, as shown in FIG. 10B, each of the rising edge timings t01, t11, and t21 of the delay strobe signal CK0, the delay strobe signal CK1, and the delay strobe signal CK2 is shifted by a certain amount (for example, $\Delta t1$), and each of the rising edge timings is changed to t02, t12, and t22. That is, the rising edge timing of the delay strobe signal CK0 can be shifted by a small amount (for example, $\Delta t1$) in a direction closer to the vicinity of the center of the valid data window TPw. As a result, the timing margin of the setting up can be secured while the signal processing for the communication with the memory device 120 is continuously performed.

Next, a delay control operation in a case where the drift occurs in a direction in which the timing margin for the holding decreases will be described with reference to FIGS. 11A and 11B. FIGS. 11A and 11B are waveform views showing the delay control operation.

When a temperature fluctuates and/or a power supply voltage fluctuates after performing of the training process, the timing of the data signal and/or the strobe signal may again drift from the values when the training process was performed, thereby resulting in a state shown in FIG. 11A. In this case, the timing margin for the holding decreases.

In the state shown in FIG. 11A, the rising edge timing t21 of the delay strobe signal CK2 deviates from the valid data window TPw, and becomes a timing slightly after the end timing t1 of the valid data window TPw. In this case, the delay strobe signal CK0 approaches the right edge side of the delay data signal DQ' [0:7] from the center of the valid data window TPw, and the timing margin for holding the delay data signal DQ' [0:7] decreases.

In response thereto, at least one determination circuit 322 out of the plurality of determination circuits 322 [0:7] outputs a logic level (for example, "1") indicating the occurrence of the mismatch, as a determination result, to the control circuit 33. In this case, all of the plurality of determination circuits 321 [0:7] output a logic level (for example, "0") indicating the match, as a determination result, to the control circuit 33. The control circuit 33 controls the delay circuit DL2 in response to receiving the determination result indicating the occurrence of the mismatch from at least one determination circuit 322, and decreases each of the delay amount Δt0, the delay amount Δt0−Δt1, and the delay amount Δt0+Δt2. In this case, the control circuit 33 may decrease each of the delay amount Δt0, the delay amount Δt0−Δt1, and the delay amount Δt0+Δt2 by Δt2.

In this manner, as shown in FIG. 11B, each of the rising edge timings t01, t11, and t21 of the delay strobe signal CK0, the delay strobe signal CK1, and the delay strobe signal CK2 is shifted by a certain amount (for example, Δt2), and each of the rising edge timings is changed to t03, t13, and t23. That is, the rising edge timing of the delay strobe signal CK0 can be shifted by a small amount (for example, Δt2) in the direction closer to the vicinity of the center of the valid data window TPw. As a result, the timing margin for the holding can be secured while the signal processing for the communication with the memory device 120 is continuously performed.

Figure 12:
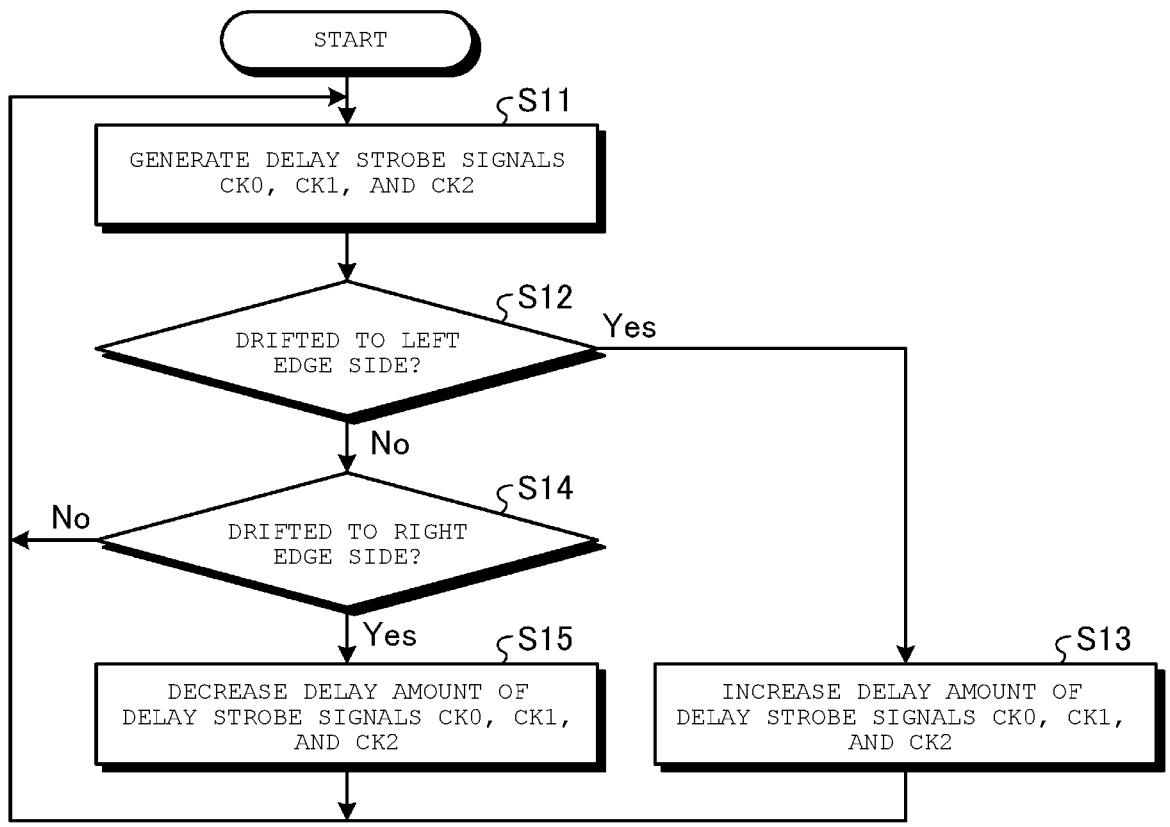
FIG. 12 is a flowchart of a delay control operation in an embodiment.

Next, the delay control operation will be described with reference to FIG. 12. FIG. 12 is a flowchart of the delay control operation.

The memory interface 100 generates the delay strobe signals CK0, CK1, and CK2 (S11). The memory interface 100 delays the strobe signal DQS by the delay amount Δt0, thereby generating the delay strobe signal CK0. The memory interface 100 delays the strobe signal DQS by the delay amount Δt0−Δt1, thereby generating the delay strobe signal CK1. The memory interface 100 delays the strobe signal DQS by the delay amount of Δt0+Δt2, thereby generating the delay strobe signal CK2.

The memory interface 100 detects the drift of the timing of the delay strobe signal CK0 with respect to the delay data signals DQ' [0:7] by using the delay data signals DQ' [0:7], the delay strobe signal CK0, the delay strobe signal CK1, and the delay strobe signal CK2. Specifically, the memory interface 100 performs the processes of S12 and S14.

The memory interface 100 determines whether the timing of the delay strobe signal CK0 with respect to the delay data signal DQ' [0:7] has drifted to the left edge side by using the delay data signal DQ' [0:7], the delay strobe signal CK0, the delay strobe signal CK1, and the delay strobe signal CK2 (S12). In a case where at least one determination circuit 321 out of the plurality of determination circuits 321 [0:7] determines the occurrence of a mismatch, the memory interface 100 can determine that the timing of the delay strobe signal CK0 with respect to the delay data signal DQ' [0:7] has drifted to the left edge side. When no determination circuit 321 out of the plurality of determination circuits 321 [0:7] detects a mismatch, the memory interface 100 can determine that the timing of the delay strobe signal CK0 with respect to the delay data signal DQ' [0:7] has not drifted to the left edge side.

If the timing of the delay strobe signal CK0 with respect to the delay data signal DQ' [0:7] has drifted to the left edge side (Yes in S12), the memory interface 100 increases each delay amount of the delay strobe signals CK0, CK1, and CK2 (S13). For example, the memory interface 100 may increase each delay amount of the delay strobe signals CK0, CK1, and CK2 by Δt1.

If the timing of the delay strobe signal CK0 with respect to the delay data signal DQ' [0:7] has not drifted to the left edge side (No in S12), the memory interface 100 determines whether the timing of the delay strobe signal CK0 with respect to the delay data signal DQ' [0:7] has drifted to the right edge side by using the delay data signal DQ' [0:7], the delay strobe signal CK0, the delay strobe signal CK1, and the delay strobe signal CK2 (S14). In a case where at least one determination circuit 322 out of the plurality of determination circuits 322 [0:7] determines the occurrence of a mismatch, the memory interface 100 can determine that the timing of the delay strobe signal CK0 with respect to the delay data signal DQ' [0:7] has drifted to the right edge side. When no determination circuit 322 out of the plurality of determination circuits 322 [0:7] detects a mismatch, the memory interface 100 can determine that the timing of the delay strobe signal CK0 with respect to the delay data signal DQ' [0:7] has not drifted to the right edge side.

If the timing of the delay strobe signal CK0 with respect to the delay data signal DQ'[0:7] has drifted to the right edge side (Yes in S14), the memory interface 100 decreases each delay amount of the delay strobe signals CK0, CK1, and CK2 (S15). For example, the memory interface 100 may reduce each delay amount of the delay strobe signals CK0, CK1, and CK2 by Δt2.

If the timing of the delay strobe signal CK0 with respect to the delay data signal DQ' [0:7] has not drifted to the right edge side (No in S14), the memory interface 100 determines that the drift is not detected, and the process returns to S11.

As described above, the memory interface 100 detects the drift in the timing of the strobe signal with respect to the data signal, and adjusts the delay amount of the strobe signal in the direction corresponding to the drift. In this manner, the delay amount of the data signal and the strobe signal can be optimized. The timing margin for setting up and holding the data signal can be secured while the signal processing for the communication with the memory device 120 is still continuously performed.

When the difference between the timing margin for the setting up and the timing margin for the holding can be ignored, the difference delay amounts Δt1 and Δt2 may be equal to each other. That is, the difference Δt1 between the delay amount of the delay strobe signal CK1 and the delay amount of the delay strobe signal CK0 and the difference Δt2 between the delay amount of the delay strobe signal CK0 and the delay amount of the delay strobe signal CK2 may be equal to each other. In addition, in this case, the amount for shifting the edge timing of each of the delay strobe signals CK0, CK1, and CK2 in a case of FIG. 10A and the amount for shifting the edge timing of each of the delay strobe signals CK0, CK1, and CK2 in a case of FIG. 11A may be equal to each other in terms of absolute values.

Alternatively, a case where the drift in the timing of the data signal and/or the strobe signal occurs due to the temperature fluctuations and/or the power supply voltage fluctuations after the training process has been described as an example. However, there is a possibility that the drift may occur during a training period. Therefore, during the training period, the memory interface 100 may set the delay amount of the delay strobe signals CK0, CK1, and CK2 through the training process performed by the training circuit 34, and thereafter, may cause the detection circuit 32 and the control circuit 33 to finely adjust the delay amount of the delay strobe signals CK0, CK1, and CK2. For example, during the training period, the memory interface 100 may cause the training circuit 34 to perform the processes in S1 to S4 of FIG. 9, and thereafter, may cause the detection circuit 32 and the control circuit 33 to perform the processes in S11 to S15 of FIG. 12. In this manner, it is possible to improve accuracy of the training process. In addition, for example, during the training period, instead of the training circuit 34, the memory interface 100 may cause the detection circuit 32 and the control circuit 33 to perform the processes S1 to S4 of FIG. 9.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a memory device; and
an interface circuit connected to the memory device via a wired communication path, wherein
the interface circuit includes:
a first delay circuit configured to apply a delay to a data signal to generate a delayed data signal;
a second delay circuit configured to generate:
a first delay strobe signal in which a strobe signal synchronized to the data signal is delayed by a first delay amount,
a second delay strobe signal in which the strobe signal is delayed by a second delay amount less than the first delay amount, and
a third delay strobe signal in which the strobe signal is delayed by a third delay amount larger than the first delay amount;
a detection circuit configured to detect a drift in a timing of the first delay strobe signal with respect to the delayed data signal by using a logic value of the delayed data signal in synchronization with the first delay strobe signal, a logic value of the delayed data signal in synchronization with the second delay strobe signal, and a logic value of the delayed data signal in synchronization with the third delay strobe signal; and
a control circuit configured to adjust the first delay amount, the second delay amount, and the third delay amount to secure a timing margin for the delayed data signal by compensating for the detected drift.

2. The memory system according to claim 1, wherein
a difference between the first delay amount and the second delay amount is a fixed amount,
a difference between the first delay amount and the third delay amount is a fixed amount, and
the control circuit is configured to change each of the first delay amount, the second delay amount, and the third delay amount by the same amount.

3. The memory system according to claim 1, wherein
a first difference between the first delay amount and the second delay amount is larger than a second difference between the first delay amount and the third delay amount, and
the control circuit is configured to change each of the first delay amount, the second delay amount, and the third delay amount while keeping the first difference larger than the second difference.

4. The memory system according to claim 1, further comprising:

a sampler including a first flip-flop having a first node for receiving the delayed data signal and a second node for receiving the first delay strobe signal, wherein
the detection circuit includes:
a second flip-flop having a third node for receiving the delayed data signal and a fourth node for receiving the second delay strobe signal,
a third flip-flop having a fifth node for receiving the delayed data signal and a sixth node for receiving the third delay strobe signal,
a first determination circuit configured to detect a match or a mismatch between an output from the first flip-flop and an output from the second flip-flop, and
a second determination circuit configured to detect a match or a mismatch between the output from the first flip-flop and an output from the third flip-flop, and
the control circuit is configured to adjust the first delay amount, the second delay amount, and the third delay amount to reduce a mismatch detected by the first determination circuit or the second determination circuit.

5. The memory system according to claim 4, wherein
when the first determination circuit detects the mismatch, the control circuit is configured to decrease each of the first delay amount, the second delay amount, and the third delay amount, and
when the second determination circuit detects the mismatch, the control circuit is configured to increase each of the first delay amount, the second delay amount, and the third delay amount.

6. The memory system according to claim 4, further comprising:
a plurality of the first delay circuits in the interface circuit,
a plurality of the first flip-flops in the sampler,
a plurality of the second flip-flops in the detection circuit,
a plurality of the third flip-flops in the detection circuit,
a plurality of the first determination circuits in the detection circuit, and
a plurality of the second determination circuits in the detection circuit, wherein
the wired communication path includes a bus wiring having a multi-bit width to accommodate a plurality of bits,
each of the plurality of first delay circuits receive data in parallel from the memory device via the bus wiring,
the plurality of first flip-flops respectively correspond to the plurality of first delay circuits, and each first node of the respective first flip-flops is connected to a corresponding one of the first delay circuits,
the plurality of second flip-flops respectively correspond to the plurality of first delay circuits and each third node of the respective second flip-flops is connected to a corresponding one of the first delay circuits,
the plurality of third flip-flops respectively correspond to the plurality of first delay circuits, and each fifth node of the respective third flip-flops is connected to a corresponding one of the first delay circuits,
the plurality of first determination circuits respectively correspond to the plurality of first flip-flops and the plurality of second flip-flops, and each of the plurality of first determination circuits is configured to detect a mismatch between an output from the corresponding first flip-flop and an output from the corresponding second flip-flop,
the plurality of second determination circuits respectively correspond to the plurality of first flip-flops and the plurality of third flip-flops, and each of the plurality of second determination circuits is configured to detect a mismatch between an output from the corresponding first flip-flop and an output from the corresponding third flip-flop, and the control circuit is configured to adjust the first delay amount, the second delay amount, and the third delay amount to reduce a detected mismatch detected by the first determination circuits or the second determination circuits.

7. A signal delay control method for a memory system, the method comprising:

generating a delayed data signal by applying a delay to a data signal received from a memory device via a wired communication path;

generating a first delay strobe signal in which a strobe signal synchronized to the data signal is delayed by a first delay amount;

generating a second delay strobe signal in which the strobe signal is delayed by a second delay amount less than the first delay amount;

generating a third delay strobe signal in which the strobe signal is delayed by a third delay amount larger than the first delay amount;

detecting a drift in a timing of the first delay strobe signal with respect to the delayed data signal by using a logic value of the delayed data signal in synchronization with the first delay strobe signal, a logic value of the delayed data signal in synchronization with the second delay strobe signal, and a logic value of the delayed data signal in synchronization with the third delay strobe signal; and adjusting the first delay amount, the second delay amount, and the third delay amount to secure a timing margin for the delayed data signal by compensating for the detected drift.

8. The signal delay control method according to claim 7, wherein the detecting the drift comprises:

detecting a mismatch between a first signal that corresponds to the logic value of the delayed data signal that has been held and then output by a first flip-flop in synchronization with the first delay strobe signal and a second signal that corresponds to the logic value of the delayed data signal that has been held and then output by a second flip-flop in synchronization with the second delay strobe signal, and detecting a mismatch between the first signal and a third signal that corresponds to the logic value of the delayed data signal that has been held and then output by a third flip-flop in synchronization with the third delay strobe signal.

9. The signal delay control method according to claim 8, wherein the adjusting comprises:

adjusting the first delay amount, the second delay amount, and the third delay amount to reduce the detected mismatch between the first signal and the second signal.

10. The signal delay control method according to claim 9, wherein the adjusting further comprises:

adjusting the first delay amount, the second delay amount, and the third delay amount to reduce the detected mismatch between the first signal and the third signal.

11. The signal delay control method according to claim 8, wherein the adjusting comprises:

adjusting the first delay amount, the second delay amount, and the third delay amount to reduce the detected mismatch between the first signal and the third signal.

12. The signal delay control method according to claim 8, wherein when the mismatch between the first and second signals is detected, each of the first delay amount, the second delay amount, and the third delay amount is decreased, and when the mismatch between the first and third signals is detected each of the first delay amount, the second delay amount, and the third delay amount is increased.

13. The signal delay control method according to claim 7, wherein a difference between the first delay amount and the second delay amount is a fixed amount, a difference between the first delay amount and the third delay amount is a fixed amount, and each of the first delay amount, the second delay amount, and the third delay amount are changed by the same amount.

14. The signal delay control method according to claim 7, wherein a first difference between the first delay amount and the second delay amount is larger than a second difference between the first delay amount and the third delay amount, and each of the first delay amount, the second delay amount, and the third delay amount are changed such that the first difference remains larger than the second difference.

15. A memory controller, comprising:

a memory interface circuit having terminals for connecting to a memory device via a multi-bit wired communication path, wherein the memory interface circuit includes:

a first delay circuit configured to apply a delay to a data signal to generate a delayed data signal;

a second delay circuit configured to generate:

a first delay strobe signal in which a strobe signal synchronized to the data signal is delayed by a first delay amount, a second delay strobe signal in which the strobe signal is delayed by a second delay amount less than the first delay amount, and a third delay strobe signal in which the strobe signal is delayed by a third delay amount larger than the first delay amount;

a detection circuit configured to detect a drift in a timing of the first delay strobe signal with respect to the delayed data signal by using a logic value of the delayed data signal in synchronization with the first delay strobe signal, a logic value of the delayed data signal in synchronization with the second delay strobe signal, and a logic value of the delayed data signal in synchronization with the third delay strobe signal; and a control circuit configured to adjust the first delay amount, the second delay amount, and the third delay amount to secure a timing margin for the delayed data signal by compensating for the detected drift.

16. The memory controller according to claim 15, wherein a difference between the first delay amount and the second delay amount is a fixed amount, a difference between the first delay amount and the third delay amount is a fixed amount, and the control circuit is configured to change each of the first delay amount, the second delay amount, and the third delay amount by the same amount.

17. The memory controller according to claim 15, wherein
  a first difference between the first delay amount and the second delay amount is larger than a second difference between the first delay amount and the third delay amount, and
  the control circuit is configured to change each of the first delay amount, the second delay amount, and the third delay amount while keeping the first difference larger than the second difference.

18. The memory controller according to claim 15, further comprising:
  a sampler including a first flip-flop having a first node for receiving the delayed data signal and a second node for receiving the first delay strobe signal, wherein
  the detection circuit includes:
    a second flip-flop having a third node for receiving the delayed data signal and a fourth node for receiving the second delay strobe signal,
    a third flip-flop having a fifth node for receiving the delayed data signal and a sixth node for receiving the third delay strobe signal,
    a first determination circuit configured to detect a match or a mismatch between an output from the first flip-flop and an output from the second flip-flop, and
    a second determination circuit configured to detect a match or a mismatch between the output from the first flip-flop and an output from the third flip-flop, and
  the control circuit is configured to adjust the first delay amount, the second delay amount, and the third delay amount to reduce a mismatch detected by the first determination circuit or the second determination circuit.

19. The memory controller according to claim 18, further comprising:
  a plurality of the first delay circuits in the memory interface circuit,
  a plurality of the first flip-flops in the sampler,
  a plurality of the second flip-flops in the detection circuit,
  a plurality of the third flip-flops in the detection circuit,
  a plurality of the first determination circuits in the detection circuit, and
  a plurality of the second determination circuits in the detection circuit, wherein
  each of the plurality of first delay circuits receive data in parallel via the terminals,
  the plurality of first flip-flops respectively correspond to the plurality of first delay circuits, and each first node of the respective first flip-flops is connected to a corresponding one of the first delay circuits,
  the plurality of second flip-flops respectively correspond to the plurality of first delay circuits and each third node of the respective second flip-flops is connected to a corresponding one of the first delay circuits,
  the plurality of third flip-flops respectively correspond to the plurality of first delay circuits, and each fifth node of the respective third flip-flops is connected to a corresponding one of the first delay circuits,
  the plurality of first determination circuits respectively correspond to the plurality of first flip-flops and the plurality of second flip-flops, and each of the plurality of first determination circuits is configured to detect a mismatch between an output from the corresponding first flip-flop and an output from the corresponding second flip-flop,
  the plurality of second determination circuits respectively correspond to the plurality of first flip-flops and the plurality of third flip-flops, and each of the plurality of second determination circuits is configured to detect a mismatch between an output from the corresponding first flip-flop and an output from the corresponding third flip-flop, and
  the control circuit is configured to adjust the first delay amount, the second delay amount, and the third delay amount to reduce a mismatch detected by the first determination circuits or the second determination circuits.

20. The memory controller according to claim 15, further comprising:
  a transmission circuit configured to supply the strobe signal and the data signal to the memory interface circuit.

* * * * *